(12) United States Patent
Lambrache et al.

(10) Patent No.: US 7,295,466 B2
(45) Date of Patent: Nov. 13, 2007

(54) USE OF RECOVERY TRANSISTORS DURING WRITE OPERATIONS TO PREVENT DISTURBANCE OF UNSELECTED CELLS

(75) Inventors: Emil Lambrache, Campbell, CA (US); Duncan Curry, Sunnyvale, CA (US); Richard F. Pang, Milpitas, CA (US)

(73) Assignee: Atmel Corporation, San Jose, CA (US)

( * ) Notice: Subject to any disclaimer, the term of this patent is extended or adjusted under 35 U.S.C. 154(b) by 3 days.

(21) Appl. No.: 11/303,368

(22) Filed: Dec. 16, 2005

(65) Prior Publication Data

US 2007/0140002 A1    Jun. 21, 2007

(51) Int. Cl.
    *G11C 16/00*    (2006.01)

(52) U.S. Cl. .................. 365/185.02; 365/185.18; 365/185.25; 365/185.28

(58) Field of Classification Search .......... 365/185.02, 365/185.18, 185.25, 185.28, 230.04
    See application file for complete search history.

(56) References Cited

U.S. PATENT DOCUMENTS

| | | | |
|---|---|---|---|
| 5,598,369 A | 1/1997 | Chen et al. ............ | 365/185.27 |
| 5,642,310 A | 6/1997 | Song ..................... | 365/185.29 |
| 5,831,896 A | 11/1998 | Lattimore et al. .......... | 365/154 |
| 6,704,239 B2* | 3/2004 | Cho et al. .............. | 365/230.04 |
| 2006/0083064 A1* | 4/2006 | Edahiro et al. ........ | 365/185.17 |

* cited by examiner

*Primary Examiner*—Hoai V. Ho
(74) *Attorney, Agent, or Firm*—Schneck & Schneck; Thomas Schneck

(57) ABSTRACT

A memory array and method for performing a write operation in a memory array that eliminates parasitic coupling between selected and unselected bitlines and protects memory cells on unselected bitlines. A memory array has a plurality of memory cells, each of which is coupled to a unique array bitline. A unique recovery transistor is coupled to each array bitline. The recovery transistors on odd bitlines are coupled to a first and second voltage, while the recovery transistors on even bitlines are coupled to a first and third voltage. During a write operation, each recovery transistor coupled to an unselected bitline is active during a write operation and a recovery operation, while each recovery transistor coupled to a selected bitline is active during a recovery operation. The first voltage is sufficient to prevent parasitic coupling between the selected bitlines and the unselected bitlines during the write operation.

15 Claims, 3 Drawing Sheets

USE OF RECOVERY TRANSISTORS DURING WRITE OPERATIONS TO PREVENT DISTURBANCE OF UNSELECTED CELLS

TECHNICAL FIELD

This invention concerns memory arrays, particularly those memory arrays with recovery transistors.

BACKGROUND

Non-volatile memories are an important component of numerous electronic devices. Electrically erasable programmable read-only memory ("EEPROM") is a particularly useful non-volatile memory. Flash memory, a type of EEPROM memory, allows multiple memory locations to be written to or erased in one operation.

In flash memory, information is stored in an array of floating gate transistors (usually floating gate MOSFET transistors), or cells. A floating gate MOSFET may be programmed by Fowler-Nordheim tunneling or by channel hot electron injection at the drain region.

In some memory arrays, memory cells on unselected bitlines may be affected during write operations on selected bitlines. In FIG. 1, a portion of an exemplary memory array 10 contains four bitlines—$BL_0$ 14, $BL_1$ 16, $BL_2$ 18, and $BL_3$ 20. (The following description of a configuration of a memory array is for exemplary purposes only and it will be apparent to those of skill in the art that the conditions associated with this particular configuration may be found in other configurations of memory arrays.) Each bitline is coupled to a memory cell 80, 78, 82, 84. Each memory cell, for instance memory cell 78, comprises a double gate NMOS transistor 54, with a floating gate 72 and a control gate 74. The memory cell 78 also has an NMOS select transistor 66 with a control gate 76 coupled to a word line 50 and a drain terminal coupled to bitline 16. The source terminal of the double gate NMOS transistor 54 is coupled to an array VSS line AVSS 52, which has a potential $V_{AVSS}$. The control gate 74 of the double gate NMOS transistor 54 is coupled to a select line 56. $BL_1$ 16 also has a capacitor $P_{bulk}$ 48.

High voltage programming even bitlines ("HV_PROG_E") line 60 and high voltage programming odd bitlines ("HV_PROG_O") line 62 enable programming on even and odd bitlines, respectively. For instance, when a low voltage is asserted on HV_PROG_E 60, PMOS transistors 26 and 30 on $BL_0$ 14 and $BL_2$ 18, respectively, conduct current from voltage source 12, raising the potential on bitlines $BL_0$ 14 and $BL_2$ 18 to a potential corresponding to a high voltage programming voltage $V_{mm}$ from a voltage source 12 applied at the source terminal of the PMOS transistors 26, 30. The odd bitlines $BL_1$ 16 and $BL_3$ 20 are not raised to the potential $V_{mm}$ due to PMOS transistors 28 and 32, which do not conduct unless low voltage is asserted on HV_PROG_O 62. In this example, there is one latch 22 per two bit lines $BL_0$ 14, $BL_1$ 16 (also latch 24 for bitlines $BL_2$ 18 and $BL_3$ 20) which determine the data to be written to the memory cell on the selected bitline via voltage Q applied to the gates transistors 42 and 40 (or 38 and 36, when latch 24 is employed) on the bitlines.

If a write operation is performed on the even bitlines, $BL_0$ 14 and $BL_2$ 18, and the odd bitlines $BL_1$ 16 and $BL_3$ 20, are not selected and are floating, parasitic, or capacitive, coupling, between the selected bitlines and the unselected bitlines may affect the memory cells on the unselected bitlines. For instance, if even bitlines $BL_0$ 14 and $BL_2$ 18 are driven to a high voltage of around 12 V, capacitive coupling 44, 46 between selected bitlines $BL_0$ 14 and $BL_2$ 18 and unselected bitline $BL_1$ can also drive the floating, unselected bitline $BL_1$ to a high voltage because the capacitor 48 on $BL_1$ will start to charge as a result of charge redistribution. The memory cell 78 on the unselected bitline $BL_1$ can be affected by this charge distribution. If the threshold of the memory cell 78 is about 7 V, any charge distribution in excess of 7 V on the unselected bitline 16 will cause Fowler-Nordheim tunneling at the floating gate 72 of the memory cell 78. If the memory cell 78 is strongly erased, the tunneling can cause the memory cell 78 to become weakly erased by degrading the negative charge on the floating gate 72. Over time, this may cause permanent damage to the memory cell, i.e., the cell may be "flipped."

Therefore, there is a need for a means to prevent parasitic coupling between selected bitlines and unselected bitlines during write operations in a memory array. It would also be desirable to prevent unselected bitlines from floating during a write operation on selected bitlines.

SUMMARY

In an exemplary embodiment, a memory array has a plurality of memory cells, each of which is coupled to a unique array bitline. A unique recovery transistor is coupled to each array bitline. The recovery transistors on odd bitlines are coupled to a first and second voltage, while the recovery transistors on even bitlines are coupled to a first and third voltage. During a write operation, each recovery transistor coupled to an unselected bitline is active during a write operation and a recovery operation, while each recovery transistor coupled to a selected bitline is active during a recovery operation. The first voltage is sufficient to prevent parasitic coupling between the selected bitlines and the unselected bitlines during the write operation.

In another exemplary embodiment, a method of performing a programming operation comprises applying a programming voltage to selected (odd or even) bitlines in a memory array. Each unselected bitline is shorted to a voltage during a write operation while the programming voltage is applied to selected bitlines, thereby raising each unselected bitline to a potential which prevents parasitic coupling between the unselected bitlines and selected bitlines.

In yet another exemplary embodiment, a memory array comprises means for applying a programming voltage to a plurality of selected bitlines, each of which is coupled to a unique memory cell. The memory array also comprises means for shorting a plurality of unselected bitlines to a voltage on a first line during a programming operation on selected bitlines, thereby preventing parasitic coupling between selected bitlines and unselected bitlines during the programming operation on selected bitlines.

DETAILED DESCRIPTION

Figure 1:
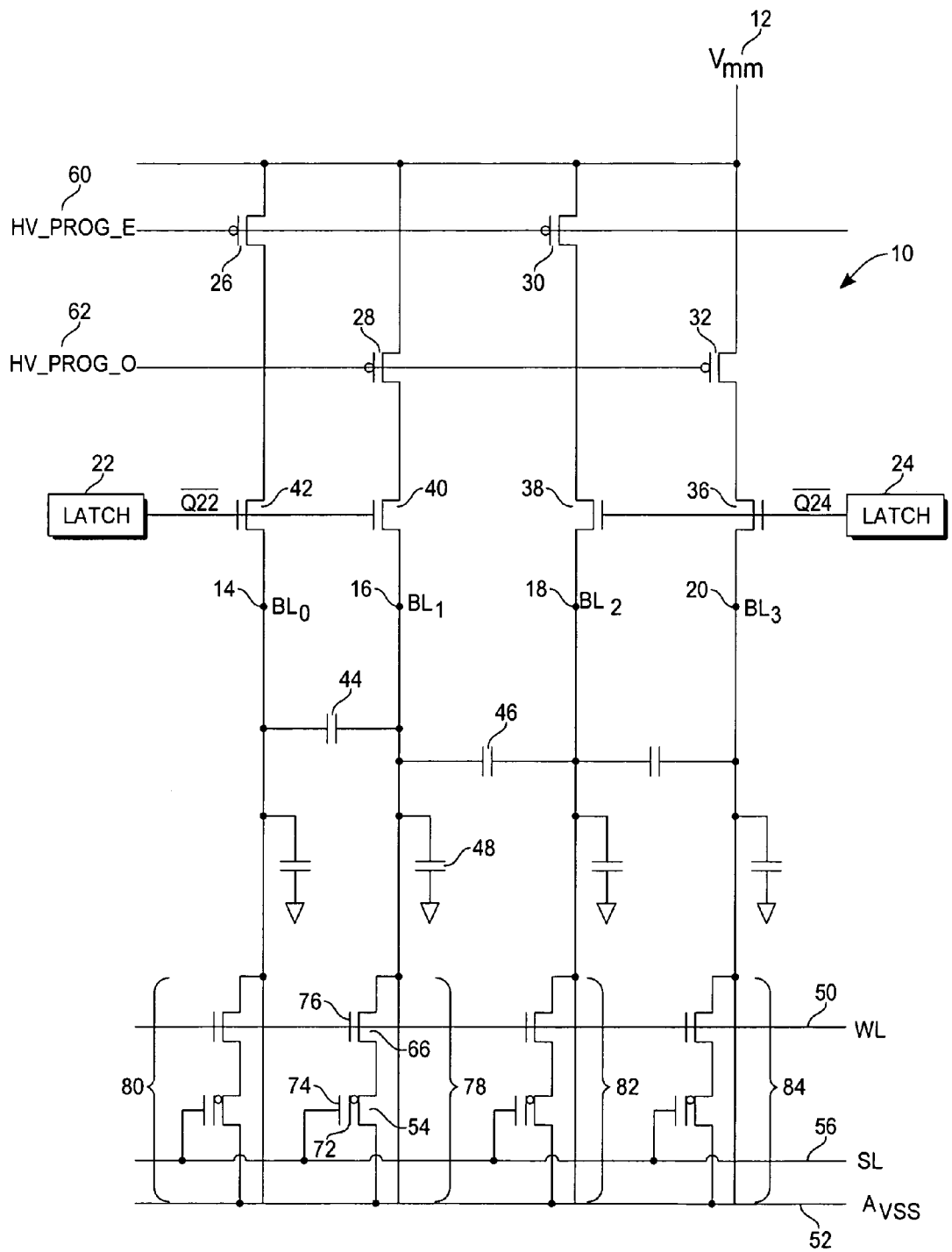
FIG. 1 is a diagram of a portion of a memory array.
Figure 2:
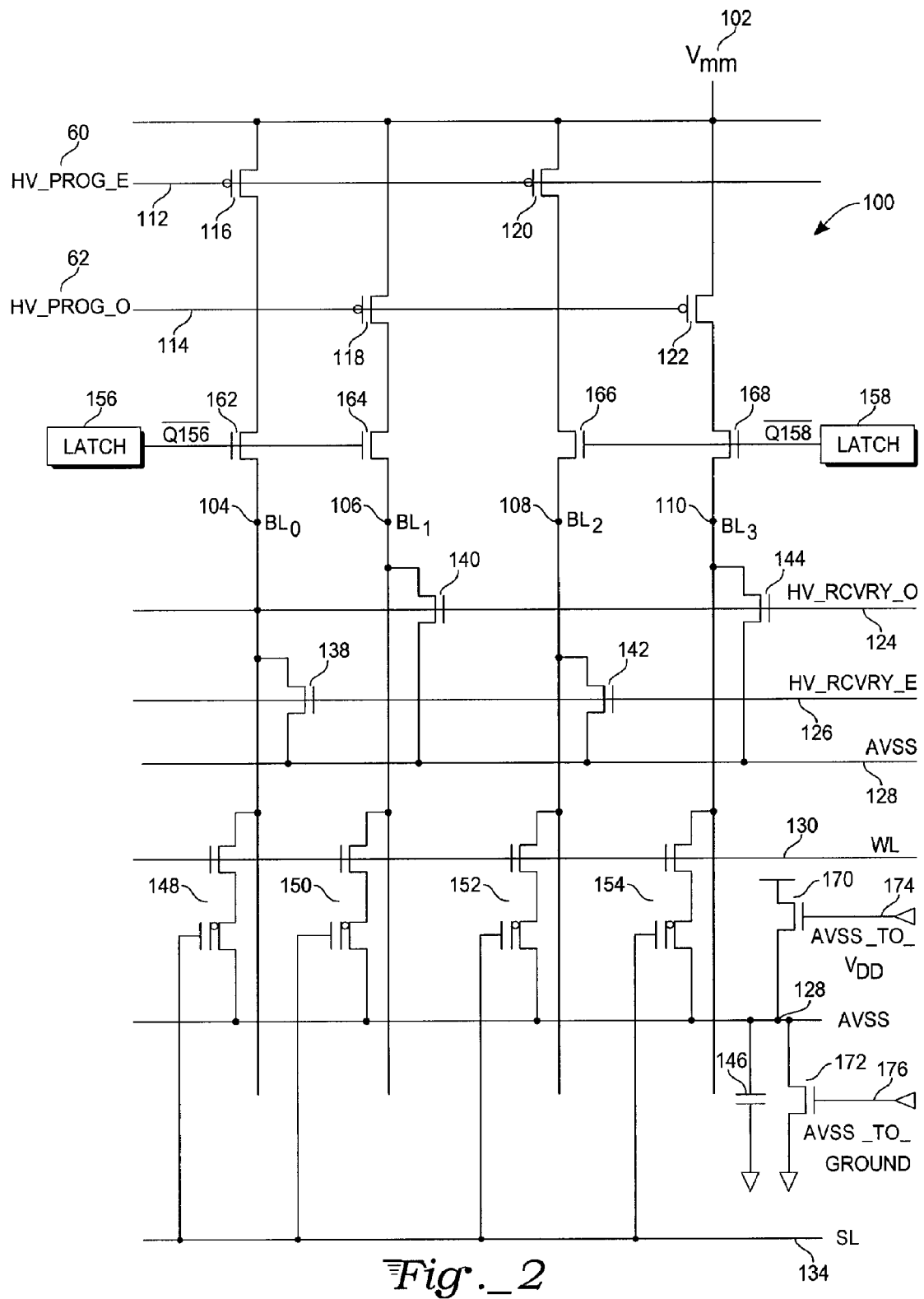
FIG. 2 is a diagram of a portion of a memory array in accordance with the present invention.

In FIG. 2, a portion of an exemplary memory array 100 contains four bitlines—$BL_0$ 104, $BL_1$ 106, $BL_2$ 108, and $BL_3$ 110. Each of the bitlines is connected to a memory cell 148, 150, 152, and 154. In this embodiment, the memory cells are similar to those described above in FIG. 1, with the drain terminal of each NMOS select transistor coupled to a bitline 104, 106, 108, 110, the source terminal of each double gate NMOS transistor coupled to an array VSS line AVSS 128, and the control gate of each double gate NMOS transistor coupled to a select line 134 which is grounded during programming operations. (Different memory cells may be employed in other embodiments.)

High voltage programming even bitlines ("HV_PROG_E") line 112 and high voltage programming odd bitlines ("HV_PROG_O") line 114 enable programming on even and odd bitlines, respectively. For instance, when a low voltage is asserted on HV_FROG_E 112, PMOS transistors 116 and 120 on $BL_0$ 104 and $BL_2$ 108, respectively, conduct a high voltage programming voltage $V_{mm}$ from a voltage source 102 applied at the source terminal of the PMOS transistors 116, 120. $V_{mm}$ is not conducted on the odd bitlines $BL_1$ 106 and $BL_3$ 110 due to PMOS transistors 118 and 122, which do not conduct unless low voltage is asserted on HV_PROG_O 114. In this example, there is one latch 156 per two bit lines $BL_0$ 104, $BL_1$ 106 (also latch 158 for bitlines $BL_2$ 108 and $BL_3$ 110) which determine the data to be written to the memory cell on the selected bitline via voltage $\overline{Q156}$ applied to the gate transistors 162 and 164 (or $\overline{Q158}$ is applied to gate transistors 166 and 168, when latch 158 is employed) on the bitlines.

Recovery transistors 138, 140, 142, and 144 are each coupled to a bitline 104, 106, 108, 110. In this embodiment, the recovery transistors are NMOS transistors whose drain terminals are coupled to a bitline in the memory array and whose source terminals are coupled to an array VSS line 128. The gates of recovery transistors 138, 142 on even bitlines 104, 108 are coupled to a high voltage recovery line ("HV_RCVRY_E") 126 for even bitlines while the gates of recovery transistors 140, 144 on odd bitlines are coupled to a high voltage recovery line ("HV_RCVRY O") 124 for odd bitlines. These recovery transistors 138, 140, 142, 144 short the unselected bitlines to $V_{AVSS}$ during a write operation on selected bitlines, completely preventing parasitic capacitive coupling between selected and unselected bitlines. As will be discussed in greater detail below, if $V_{AVSS}$ is below the threshold at which Fowler-Nordheim tunneling begins, the memory cells on unselected bit lines will not be disturbed by $V_{AVSS}$.

During a write operation, the voltage on AVSS increases due to the active bitlines. For instance, if even bitlines $BL_0$ 104 and $BL_2$ 108 are selected for programming, odd bitlines $BL_{106}$ and $BL_3$ 110 will be tied to $V_{AVSS}$. A low voltage will be asserted on HV_PROG_E 112, and the PMOS transistors 116, 120 on the selected, even bitlines $BL_0$ 104 and BL2 108 will turn on, conducting high voltage programming voltage $V_{mm}$. The PMOS transistors 118, 122 on the unselected, odd bitlines $BL_1$ 106 and $BL_3$ 110 will not conduct $V_{mm}$ if no low voltage is asserted on HV_PROG_O 114. In this embodiment, a potential of 12 V is applied by the word line 130 to the gates of the memory cells' 148, 150 NMOS select transistors which are coupled to the word line. Positive charge is injected on the floating gate of each selected memory cell's double gate NMOS transistor due to Fowler-Nordheim tunneling. The double gate NMOS transistor will conduct the voltage on the gate, charging up the voltage on AVSS 128. In this embodiment, $V_{AVSS}$ is charged to about 5.5 V (before a write operation, AVSS is at $V_{DD}$ due to the transistor 170. AVSS is coupled to a capacitor 146. AVSS is released during a write operation by a low potential applied on the line AVSS_TO_GROUND 176 to a gate of transistor 172 coupled to AVSS 128 which turns off transistor 172. At the same time, a $V_{DD}$ level is applied to the line AVSS_TO_VDD 174, which turns on the NMOS transistor 170, which charges up AVSS 128 to a voltage $V_{DD}$-Vt (here Vt is the threshold level of transistor 170). Since transistor 170 is an NMOS transistor, AVSS may be charged above $V_{DD}$ without transistor 170 clamping AVSS 128 below $V_{DD}$. When AVSS 128 is charged by the active bitlines above $V_{DD}$, transistor 170 automatically turns off because the transistor's 170 gate and drain are at $V_{DD}$.

High voltage is applied to the gates of the recovery transistors 140, 144 on the unselected bitlines 106, 110 during a write operation on selected bitlines 104, 108. In this example, high voltage is applied to the gates of the recovery transistors 140, 144 by the line HV-RCVRY_O 124. As indicated above, the source terminals of all the recovery transistors are coupled to AVSS. When high voltage is applied to the gates of the recovery transistors, the recovery transistors conduct, and the bitlines associated with the recovery transistors, in this example odd bitlines $BL_1$ 106 and $BL_3$ 110, are shorted to $V_{AVSS}$. This prevents the unselected bitline from floating during a write operation on a selected bitline. Provided $V_{AVSS}$ is below the threshold for Fowler-Nordheim tunneling (i.e., about 7 V), $V_{AVSS}$ will not disturb the memory cell on the unselected bitline. AVSS should not be tied to ground because a previously programmed cell on an unselected bitline which is tied to ground during a write operation on a selected bitline will be shorted.

During a recovery operation following the write operation, a pulse is delivered to the gates of the recovery transistors 138, 142 on the selected bitlines to discharge the selected bitlines. In this example, the pulse is delivered on HV_RCVRY_E 126. A voltage is also applied to the gates of the recovery transistors 140, 144 by HV_RCVRY_O 124 on the unselected bitlines to discharge these bitlines.

Figure 3:
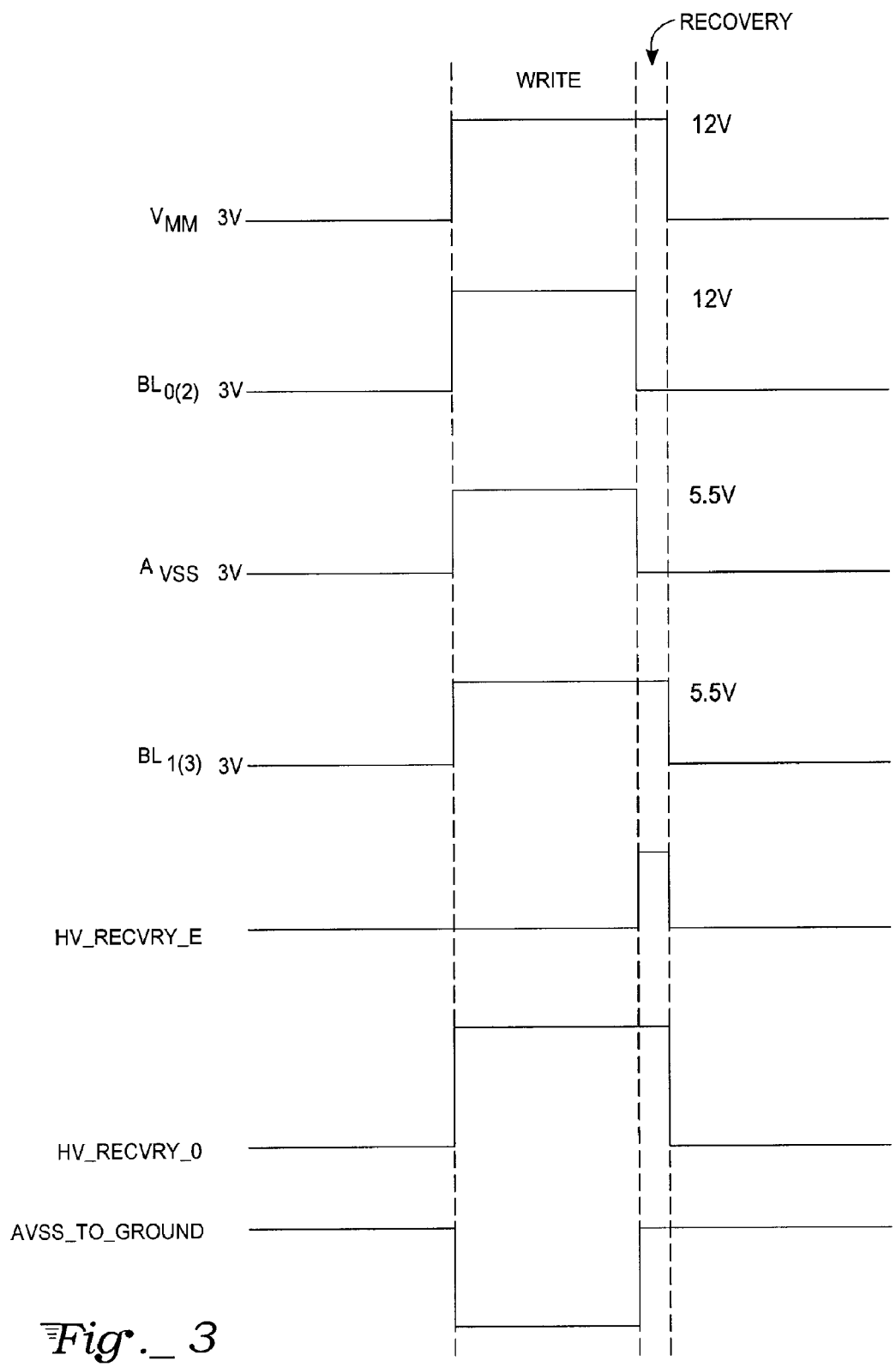
FIG. 3 is a timing diagram of a write operation and a recovery operation following the write operation.

With reference to FIG. 3, assuming $V_{DD}$=3 V, during a write operation $V_{mm}$ goes from 3 V to 12 V. Similarly, the voltage on the selected bitlines (here, even bitlines) $BL_{0(2)}$ goes from 3 V to 12 V. The potential on AVSS goes from 3 V to 5.5 V. The voltage on $BL_{0(2)}$ and AVSS returns to 3 V after the write operation is completed, i.e., during the recovery period following the write operation. The voltage on the unselected bitlines (here, odd bitlines) $BL_{1(3)}$ remains at 5.5 V (i.e., at $V_{AVSS}$) during the recovery period. This is due to a high signal being asserted by HV_RCVRY_O during both the write operation and the recovery period following the write operation. A high signal is asserted by HV_RCVRY_E only during the recovery period following the write operation. During the write operation, a low signal is asserted on AVSS_TO_GROUND.

With reference to FIG. 3, assuming $V_{DD}$=3V, during a write operation $V_{mm}$ goes from 3 V to 12 V. Similarly, the voltage on the selected bitlines (here, even bitlines) $BL_{0(2)}$ goes from 3 V to 12 V. The potential on AVSS goes from 3 V to 5.5 V. The voltage on $BL_{0(2)}$ and AVSS returns to 3 V after the write operation is completed, i.e., during the recovery period following the write operation. The voltage on the unselected bitlines (here, odd bitlines) $BL_{1(3)}$ remains at 5.5 V (i.e., at $V_{AVSS}$) during the recovery period. This is due to a high signal being asserted by HV_RCVRY_O during both the write operation and the recovery period following the write operation. A high signal is asserted by HV_RCVRY_E only during the recovery period during the write operation. During the write operation, a low signal is asserted on AVSS_TO_GROUND.

While the preceding description has described specific embodiments, it will be evident to a skilled artisan that various changes and modifications can be made to these embodiments. For instance, different configurations of the memory array and different voltages and thresholds may be employed. The specification and drawings, therefore, are to be regarded in an illustrative rather than a restrictive sense.

What is claimed is:

1. A memory array comprising:
    a) a plurality of memory cells;
    b) a plurality of array bitlines, each of the plurality of memory cells coupled to a unique one of the plurality of array bitlines, each odd bitline coupled to a unique recovery transistor which is configured to be coupled to a first voltage and a second voltage, each even bitline coupled to a unique recovery transistor which is configured to be coupled to the first voltage and a third voltage, each of the recovery transistors configured to be coupled to an unselected bitline configured to be active during a write operation and a recovery operation, each of the recovery transistors configured to be coupled to a selected bitline configured to be active during the recovery operation, and each of the recovery transistors configured such that each unselected bitline is configured to be coupled to the first voltage during a write operation, the first voltage sufficient to prevent parasitic coupling between the selected bitlines and unselected bitlines during the write operation.

2. The memory array of claim 1 wherein the first voltage is a voltage on an array source line.

3. The memory array of claim 1 wherein the second voltage is a voltage on an odd high voltage recovery line.

4. The memory array of claim 1 wherein the third voltage is a voltage on an even high voltage recovery line.

5. The memory array of claim 1 wherein the memory cell includes a floating gate MOSFET transistor.

6. The memory array of claim 5 wherein the first voltage is a voltage on a floating gate of the floating gate MOSFET transistor.

7. The memory array of claim 1 wherein the first voltage is between 5 to 6 volts.

8. The memory array of claim 1 wherein each unselected bitline is configured not to float during a write operation.

9. A method of performing a programming operation, the method comprising:
    a) applying a programming voltage to selected bitlines in a memory array, the selected bitlines either odd or even bitlines in a memory array;
    b) shorting each unselected bitline to a first voltage during a write operation while the programming voltage is applied to selected bitlines, thereby raising each unselected bitline to a potential which prevents parasitic coupling between the unselected bitlines and selected bitlines, the shorting of each unselected bitline includes application of a first recovery voltage to a transistor coupled to each unselected bitline while the programming voltage is applied; and
    c) applying a second recovery voltage to a transistor coupled to each selected bitline during a recovery operation, application of the second recovery voltage capable of coupling the selected bitlines to a second voltage.

10. The method of claim 9 wherein the potential is between 5 to 6 volts.

11. The method of claim 9 wherein unselected bitlines are not floating during a programming operation.

12. A memory array comprising:
    a) means for applying a programming voltage to a plurality of selected bitlines, each of the plurality of selected bitlines configured to be coupled to a unique memory cell;
    b) means for shorting a plurality of unselected bitlines to a first voltage on a first line during a programming operation on selected bitlines, thereby preventing parasitic coupling between selected bitlines and unselected bitlines during the programming operation on selected bitlines; and
    c) means for applying a second voltage to a selected bitline during a recovery operation.

13. The memory array of claim 12 wherein the selected bitlines are either even or odd bitlines in the memory array.

14. The memory array of claim 12 wherein the means for shorting a plurality of unselected bitlines to a first voltage on a first line includes a means for applying a second voltage to an unselected bitline during a write operation and a recovery operation.

15. The memory array of claim 12 wherein the first voltage is between 5 to 6 volts.

* * * * *